US009727102B2

(12) United States Patent
Gwin et al.

(10) Patent No.: US 9,727,102 B2
(45) Date of Patent: Aug. 8, 2017

(54) COOLING ELECTRONIC DEVICES

(71) Applicant: Intel Corporation, Santa Clara, CA (US)

(72) Inventors: Paul Gwin, Orangevale, CA (US); Harish Jagadish, Bangalore (IN); Narasimha Shastri, Bangalore (IN); Madhukar Patil, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 510 days.

(21) Appl. No.: 13/937,501

(22) Filed: Jul. 9, 2013

(65) Prior Publication Data
US 2015/0016052 A1 Jan. 15, 2015

(51) Int. Cl.
*G06F 1/20* (2006.01)
*H05K 5/03* (2006.01)
*H05K 5/00* (2006.01)
*H05K 1/09* (2006.01)

(52) U.S. Cl.
CPC ............... *G06F 1/20* (2013.01); *G06F 1/203* (2013.01); *H05K 5/00* (2013.01); *H05K 5/03* (2013.01); *H05K 1/09* (2013.01); *Y10T 29/49826* (2015.01)

(58) Field of Classification Search
CPC .. G06F 1/20; G06F 1/203; H05K 1/09; H05K 3/32; H05K 5/0243; H05K 5/03; H05K 5/04
USPC ............................................. 361/679.54, 688
See application file for complete search history.

(56) References Cited

U.S. PATENT DOCUMENTS

| | | | | | |
|---|---|---|---|---|---|
| 6,030,558 | A | * | 2/2000 | Smith | A45D 40/02 264/115 |
| 7,602,110 | B2 | * | 10/2009 | Jeong | H01J 11/12 313/46 |
| 8,320,119 | B2 | * | 11/2012 | Isoshima | H05K 7/20972 165/104.34 |
| 8,885,347 | B2 | * | 11/2014 | Choi | H04M 1/0202 361/728 |
| 2003/0090866 | A1 | * | 5/2003 | Kuo | G06F 1/16 361/679.6 |
| 2003/0169568 | A1 | * | 9/2003 | Tanaka | G06F 1/203 361/695 |
| 2004/0119410 | A1 | * | 6/2004 | Jun | H05K 7/20963 313/582 |
| 2005/0068738 | A1 | * | 3/2005 | Kim | G02F 1/133385 361/704 |
| 2005/0099106 | A1 | * | 5/2005 | Kim | H05K 9/0096 313/46 |
| 2007/0147008 | A1 | * | 6/2007 | Mongia | H05K 9/0041 361/719 |
| 2008/0017569 | A1 | * | 1/2008 | Ramsey | B01D 67/0004 210/490 |

(Continued)

*Primary Examiner* — Courtney Smith
*Assistant Examiner* — Michael Matey
(74) *Attorney, Agent, or Firm* — International IP Law Group, P.L.L.C.

(57) ABSTRACT

Techniques for providing airflow through an electronic device are described herein. An example of an electronic device includes an integrated display and a circuit board comprising a processor, a memory, and a driver circuit coupled to the integrated display. A housing encloses the integrated display and the circuit board, wherein the housing is comprised of at least two panels wherein at least one of the panels is formed from a porous material configured to allow air flow through the panel.

20 Claims, 10 Drawing Sheets

(56) References Cited

U.S. PATENT DOCUMENTS

| | | | | |
|---|---|---|---|---|
| 2011/0255727 | A1* | 10/2011 | Azuchi | G06F 1/1616 381/333 |
| 2012/0118327 | A1* | 5/2012 | Mazmanyan | B08B 15/00 134/21 |
| 2012/0250250 | A1* | 10/2012 | Tatebe | G06F 1/1656 361/679.55 |
| 2013/0271902 | A1* | 10/2013 | Lai | H04R 1/02 361/679.01 |
| 2014/0218859 | A1* | 8/2014 | Shelnutt | G06F 1/206 361/679.46 |

* cited by examiner

500

COOLING ELECTRONIC DEVICES

TECHNICAL FIELD

This disclosure relates generally to techniques for cooling electronic devices without the use of vents. More specifically, the disclosure describes the use of porous outer surfaces that allow airflow into the device, while protecting from dust and liquid intrusion.

BACKGROUND

Modern electronic circuits often generate a substantial amount of heat, due to their high density and small size. Further, many electronic devices have a unified case structure that, in the absence of appropriate vents, trap heat around the internal components. For example, all-in-one computing (AIO) computing systems have a unified case that includes a monitor, power supply, mother board, and any drives used to implement a standard desktop computer system.

As platform power in these devices and system continues to increase while form factors, e.g., thickness, continue to decrease, it will become increasingly difficult to cool platforms of the future. For example, current AIO platforms use substantial numbers of vents to allow cooling air to flow in and over the components. However, the vents also allow dust to flow into the case, lowering the effectiveness of cooling over time. Further, the vents provide no protection from the intrusion of water, dust, or other contaminants into the system.

DETAILED DESCRIPTION

Use of electronic devices, such as laptops, mobile phones, tablets, all-in-one (AIO) computers, and other devices, continues to increase, as does the locations these devices are used in. For example, users would like to use their device in public places, outdoor environments, garages, kitchens, and other places where the devices might be subjected to dust, dirt, or moisture. Many current devices use vents to allow air ingress into the device for cooling. However, having vents makes system susceptible to infiltration by dust, dirt, and fluids. Further, vents can detract from the appearance of the device.

The subject matter disclosed herein relates to techniques for cooling electronic devices without the use of vents. As described herein, one or more panels of an enclosure of the computing device may be comprised of a porous material. The porous material may form any wall or panel of the enclosure based on system thermal design and flow requirements. The porous panel may be attached to the wall of the enclosure using an adhesive material, or may be attached using other mechanical means, such as screws, a snap or latching mechanism, or through an over-molding process. In some examples, the porous panel may appear to be a solid panel, for example, with a matte finish. In these examples, the pores may be smaller than visible, for example, about 150 to about 350 micrometers (μm). In other examples, the pores may be larger, for example, between about 250 μm to about 500 μm. The selection of the size of the pores can be made depending on the amount of heat generated by the target electronic device. Larger pores allow for more air circulation, while smaller pores provide more protection from dust and liquids.

Figure 1:
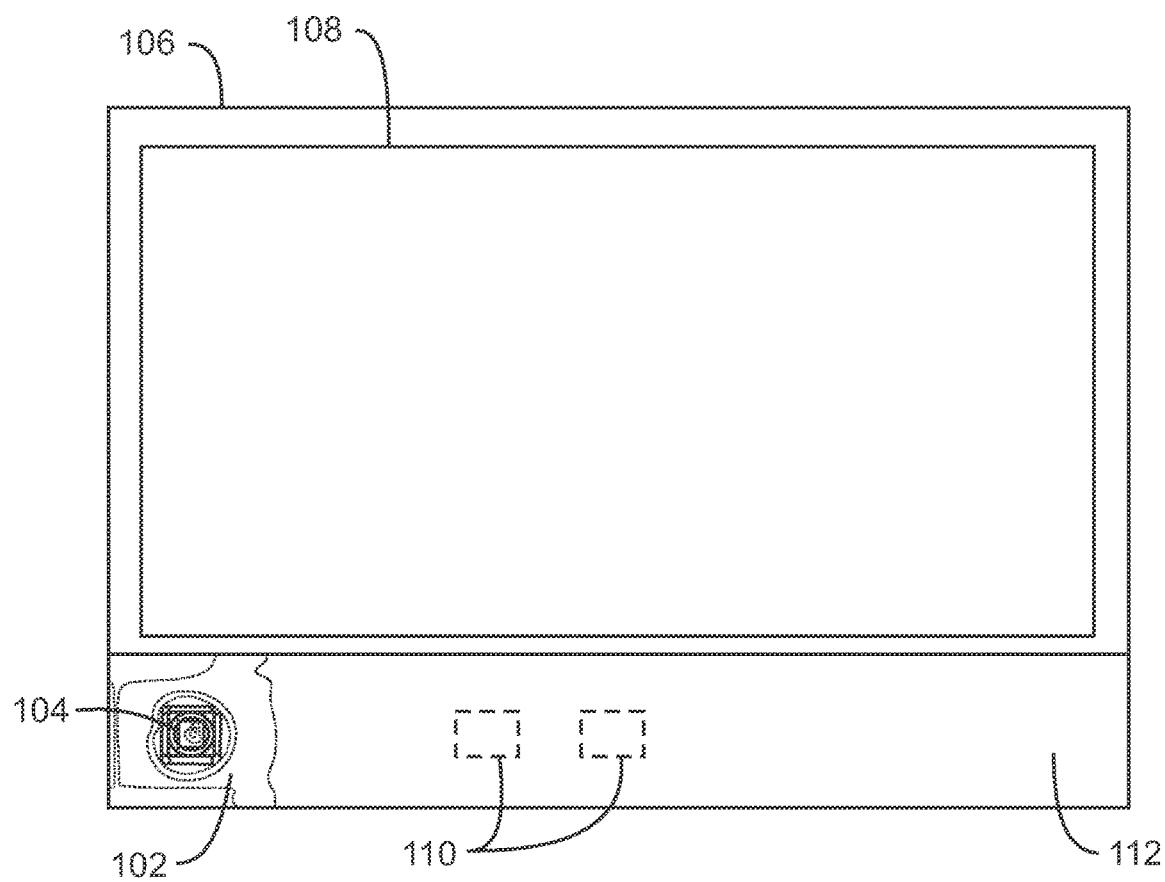
FIG. 1 is a front view of an all-in-one (AIO) computer with a cut-away section indicating the location of a heat producing part.

FIG. 1 is a front view of an all-in-one (AIO) computer 100 with a cut-away section 102 indicating the location of a heat producing part 104. The heat producing part may be, for example, a processor for the AIO system. In this particular example, the housing has an upper section 106, holding a display panel 108. The upper section 106 may be made from a porous material, allowing air to rise from components 110 mounted behind a lower section 112 of the housing. The lower section 112 may be made from the porous material to allow airflow to flow over the heat producing part 104 and the other components 110 in the lower section 112.

Figure 2:
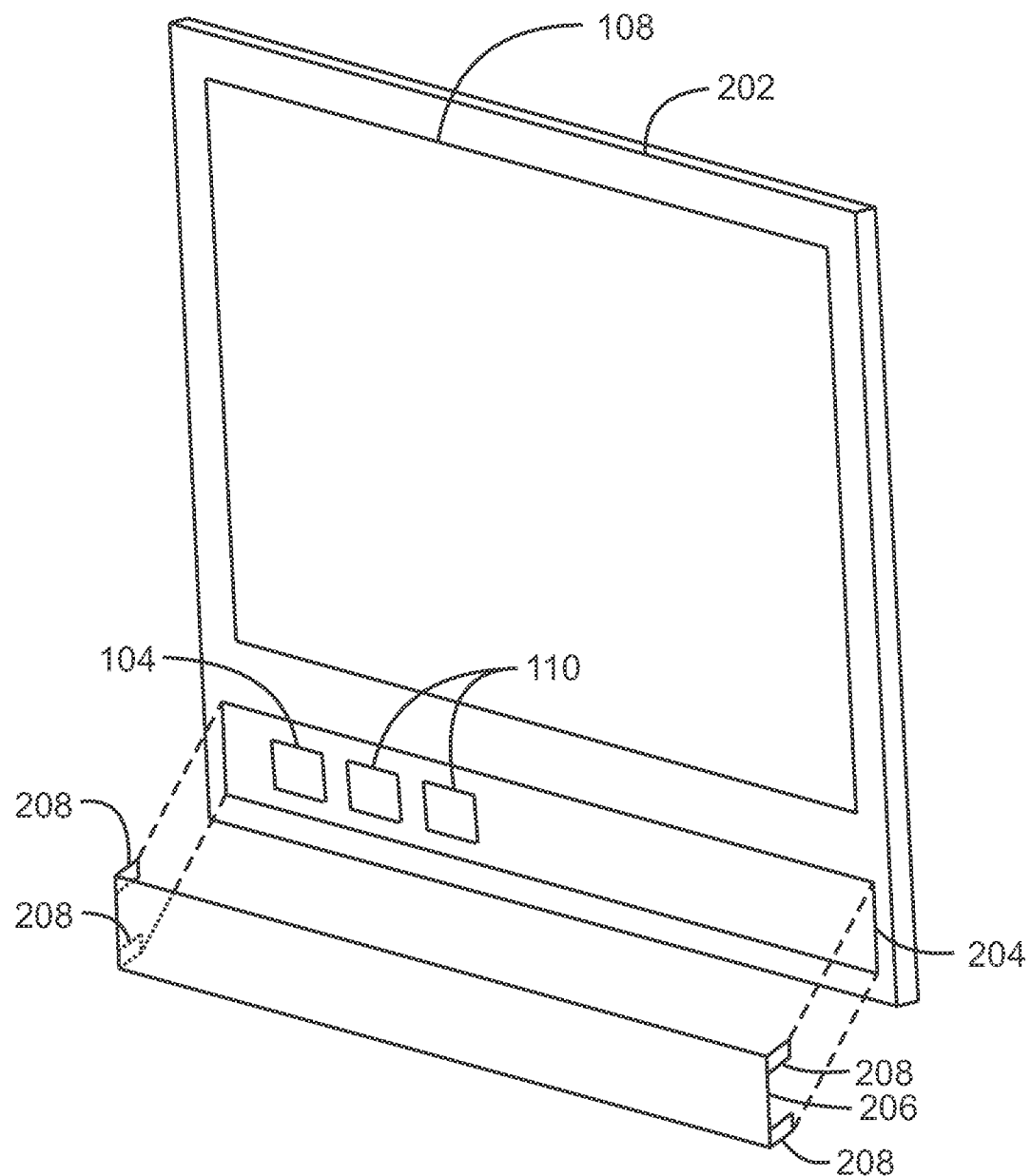
FIG. 2 is a perspective view of an AIO computer illustrating the attachment of a porous bezel to a front panel over the heat producing parts.

FIG. 2 is a perspective view of an AIO computer 200 illustrating the attachment of a porous bezel to a front panel 202 over the heat producing parts. The front panel 202 may be a single panel, with no separation between and upper section and a lower section. In this example, the front panel 202 has an opening 204 over the heat producing parts 104 and other components 110 of the AIO computer. The porous bezel 206 may fit over the opening 204 and be held in place by fasteners 208. In this example, the fasteners 208 are shown as clips that can snap inside the edges of the opening 204 to hold the porous bezel 206 in place. However, other types of fasteners 208 may be used, including screws, hook-and-loop fasteners, or adhesives, among others.

It is to be understood that the views in FIGS. 1 and 2 are not intended to indicate that the electronic device is limited to AIO computers. Any number of other electronic devices may use the technologies described herein, including tablets, laptops, mobile phones, and the like. Generally, any device that may be used in environments that can be dusty and wet can use the system. Further, the aesthetics combined with the cooling may make the use of the porous panels practical in more standard office environments. The porous panels are not limited to the front panels described with respect to FIGS. 1 and 2.

Figure 3:
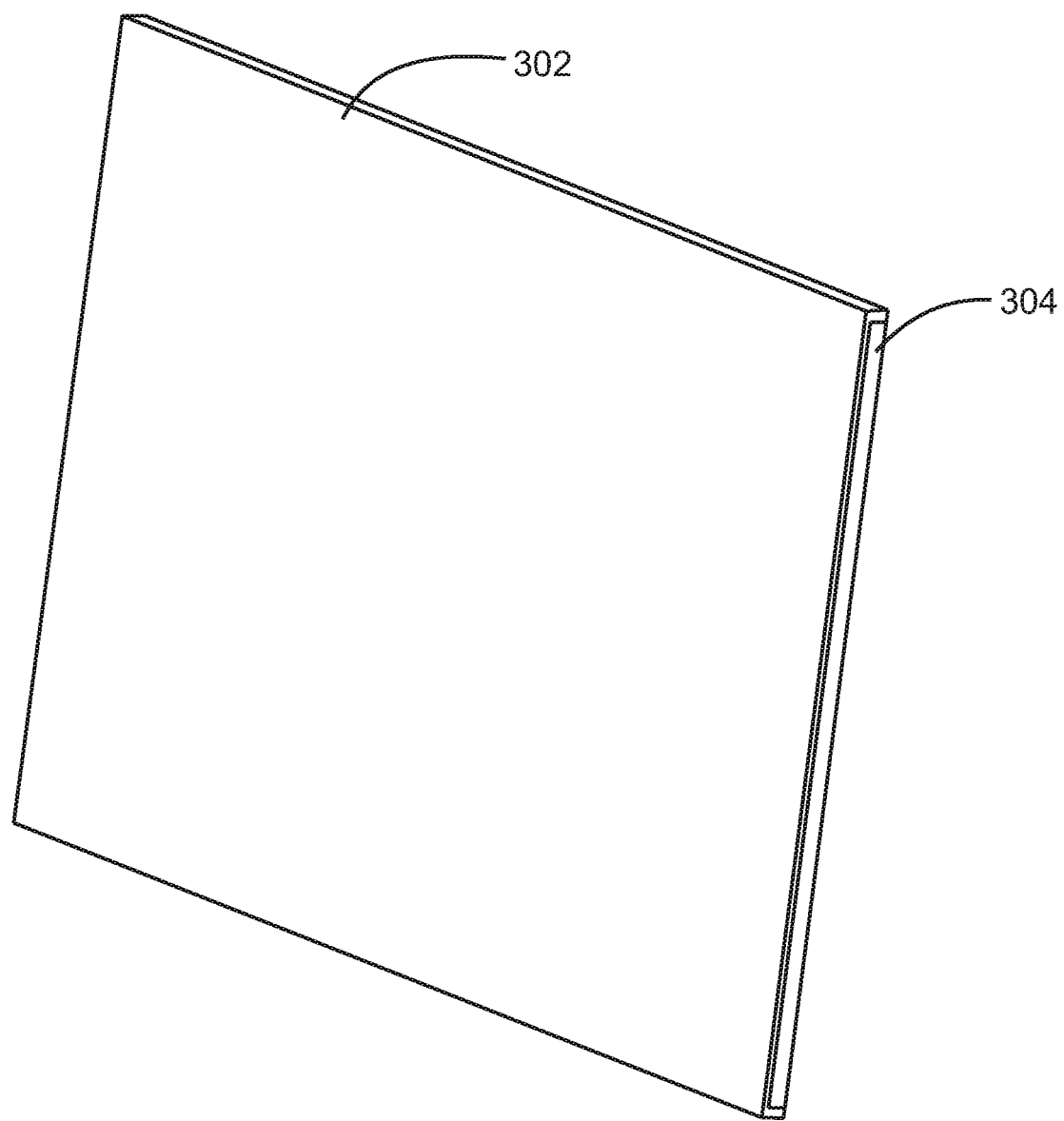
FIG. 3 is a rear perspective view of a back panel of a housing of an electronic device.

FIG. 3 is a rear perspective view of a back panel 300 of a housing of an electronic device. The use of a porous back panel 300 for the housing 302, instead of, or in addition to, a front panel 304, increases the surface area available for air infiltration, since the back panel 300 is not occupied by the display 108 (FIG. 1) of the front panel 304. However, the entire back panel 300 does not need to be formed from the porous material.

Figure 4:
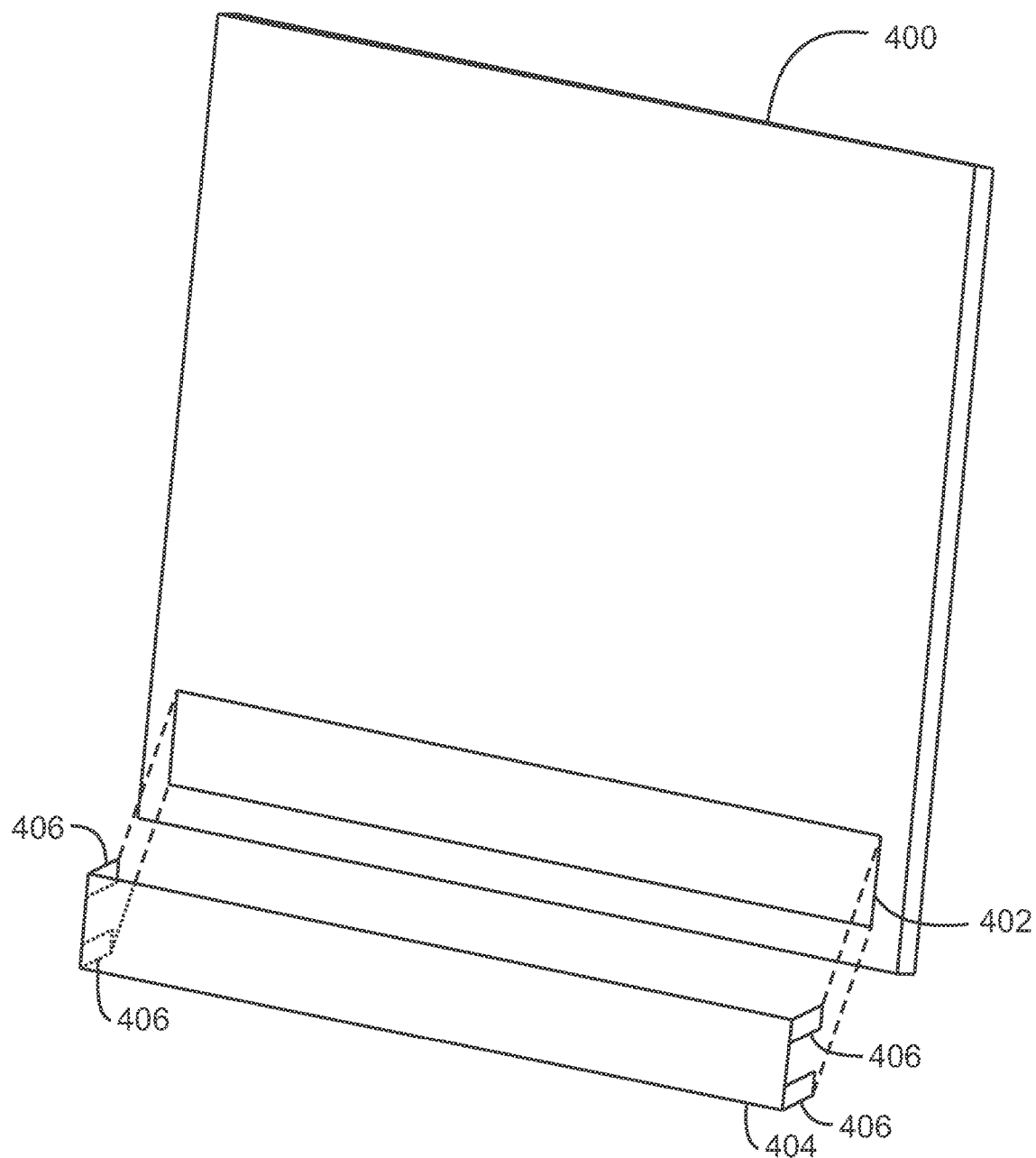
FIG. 4 is a rear perspective view of a rear panel of a housing having a porous panel attached over an opening.

FIG. 4 is a rear perspective view of a rear panel 400 of a housing having a porous panel attached over an opening 402. Similar to the example described with respect to FIG. 2, a porous bezel 404 may be attached to the rear panel 400 by fasteners such as clips 406. Other fasteners may be used instead of, or in addition to, the clips 406, such as screws, or adhesives.

Figure 5:
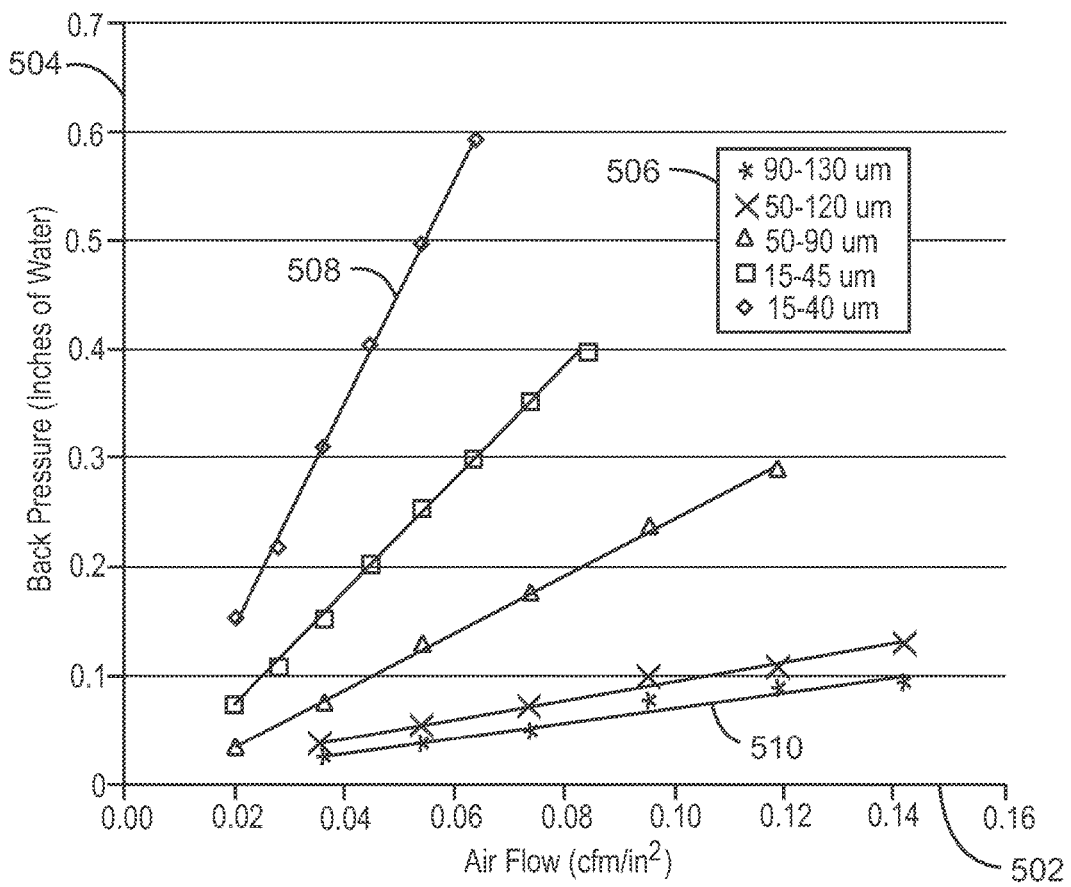
FIG. 5 is a plot of flow rates for porous panels having different pore sizes.

FIG. 5 is a plot 500 of flow rates for porous panels having different pore sizes. In the plot 500, the x-axis 502 represents the air flow rate through the panel in cubic feet per minute per square inch ($CFM/in^2$), while the y-axis 504 represents the back pressure resulting from the air flow rate 502 in inches of water. A legend 506 indicates the different average pore size ranges for the porous panels studied. The porous material may have pores ranging in size from a minimum of 1 micron up to a maximum of about 1 mm or the thickness of the porous panel, whichever is larger. The pores of the porous material allow air to be drawn through the pores of the material from one side to other. Smaller pores, for example, less than about 250 μm in size may make the porous material visually appear as a solid, i.e., non-porous, material. The size of porous skin, for example, as an entire panel or an attached porous bezel, can be selected based on the impedance to airflow of the porous material and total flow requirements. The impedance increases as the pore size decreases, even if the total porosity remains constant. This may be explained by an increase in the tortuosity of the flow path through the porous material as the pore size decreases, with smaller pores providing more tortuous paths. As shown in FIG. 5, the impedance is highest for porous panels with a pore size of about 15 μm to about 45 μm, as shown by line 508. The lowest impedance to airflow is achieved for porous panels with a pore size of about 90 μm to about 130 μm, as shown by line 510. This technology can be used in active, e.g., fan cooled systems, as well as in fan-less systems, wherein differential pressure across the porous panels allows the desired airflow for temperature control to be achieved.

Further, as noted herein, the technology also protects the electronic device from dust infiltration and fluid ingress. The porous material has an intricate network of open-celled, omni-directional pores that provide consistency throughout the media for a unique combination of diffusion, filtering, and venting capability. Due to these characteristics, when an aqueous fluid tries to enter through the pores, the impedance is much higher. For example, this may be due to the hydrophobic nature of the material, to pores that are too small for liquids to pass through, or both. Similarly, dust cannot pass through the pores and is trapped at outer surface. Resistance to water and dust infiltration typically increases as pore size decreases.

Figure 6A:
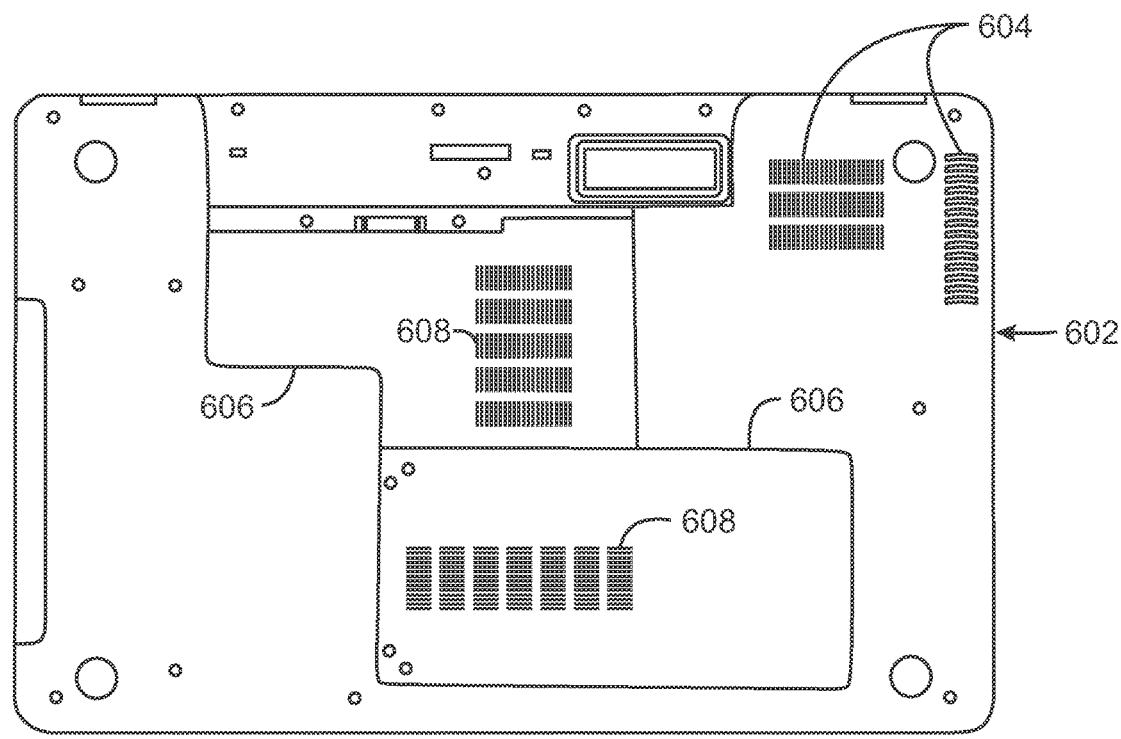
FIG. 6A is a rear view of the housing of a current all-in-one (AIO) computer housing showing the vents.

FIG. 6A is a rear view of the housing of a current all-in-one (AIO) computer housing showing the vents. The housing 602 may have vents 604 covering heat producing components, such as heat sinks, power supplies, and the like. Further, the housing can also have a number of sub-panels 606, covering specific functional units, such as disk drives, the CPU, memory, and the like. In many cases, these subpanels 606 also have vents 608 to cool the specific component.

Figure 6B:
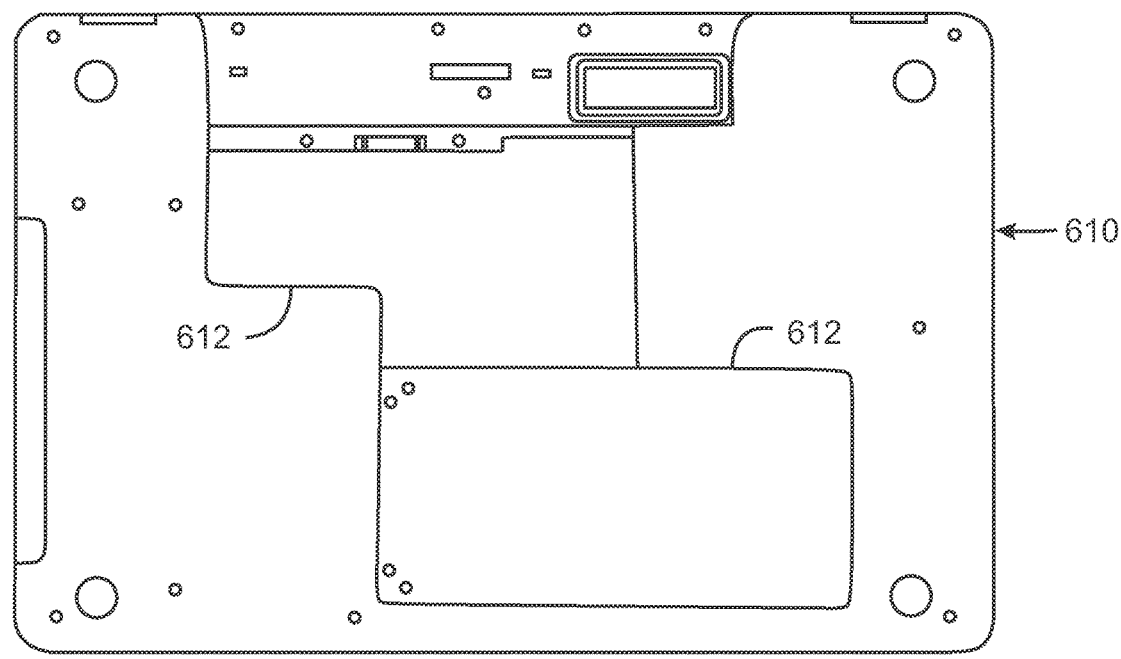
FIG. 6B is a bottom view of a laptop case formed from a porous material with the elimination of the vents.

FIG. 6B is a rear view of the housing 610 of an AIO computer made from a porous material. In this example, the sub-panels 612 are also used, but vents are not needed for the housing 610 or any of the sub-panels 612. This provides a more aesthetic housing, as well as providing increased protection from dust and fluid infiltration.

Figure 7A:
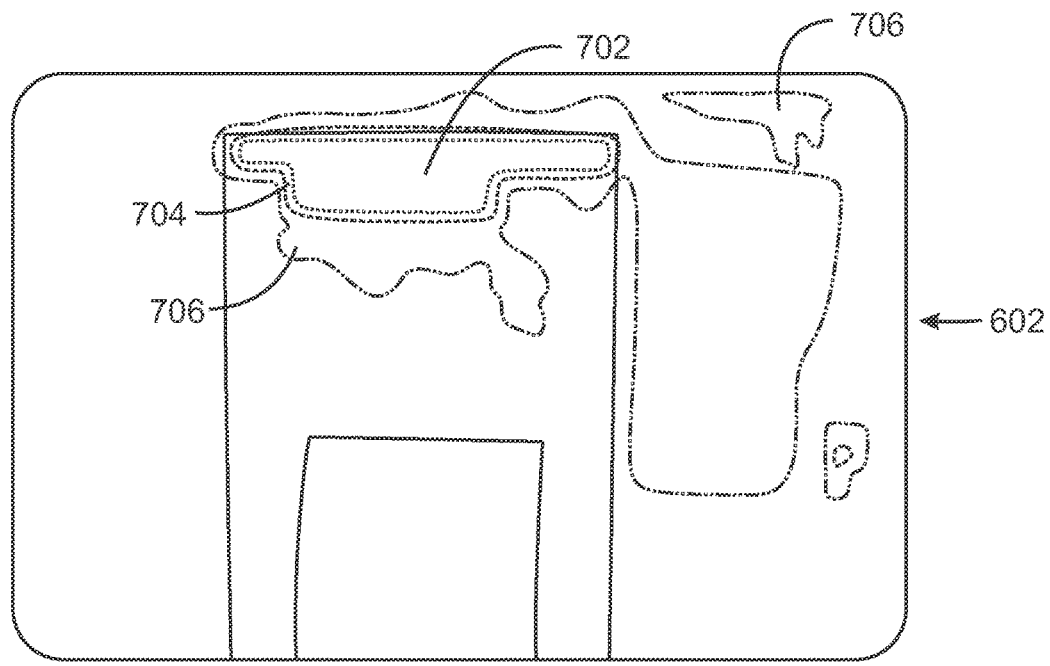
FIG. 7A is an infrared image of the AIO computer housing of FIG. 6A during operation of the system.
Figure 7B:
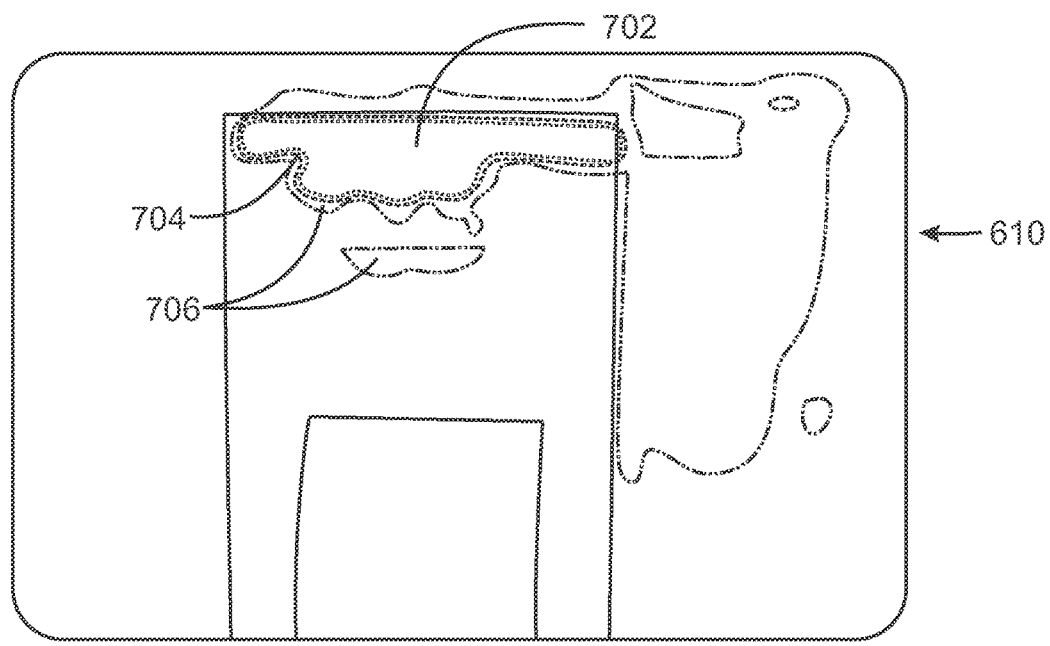
FIG. 7B is an infrared image of the AIO computer housing of FIG. 6B during operation of the system.

FIG. 7A is an infrared image of the AIO computer housing of FIG. 6A during operation of the system. The infrared image indicates temperatures that are above ambient. The different elevated temperature zones are indicated as regions 702, 704, and 706 on the infrared image, wherein a first region 702 is at the highest temperature, and intermediate region 704 is at a somewhat lower temperature, and a third region 706 is at a yet lower temperature. In contrast to the more elevated temperature regions The majority of the back of the housing is outside of these FIG. 7B is an infrared image of the AIO computer housing of FIG. 6B during operation of the system. As can be seen in this image, the heat profile of the case is not substantially different from that shown in FIG. 7A for a case having vents.

Figure 8A:
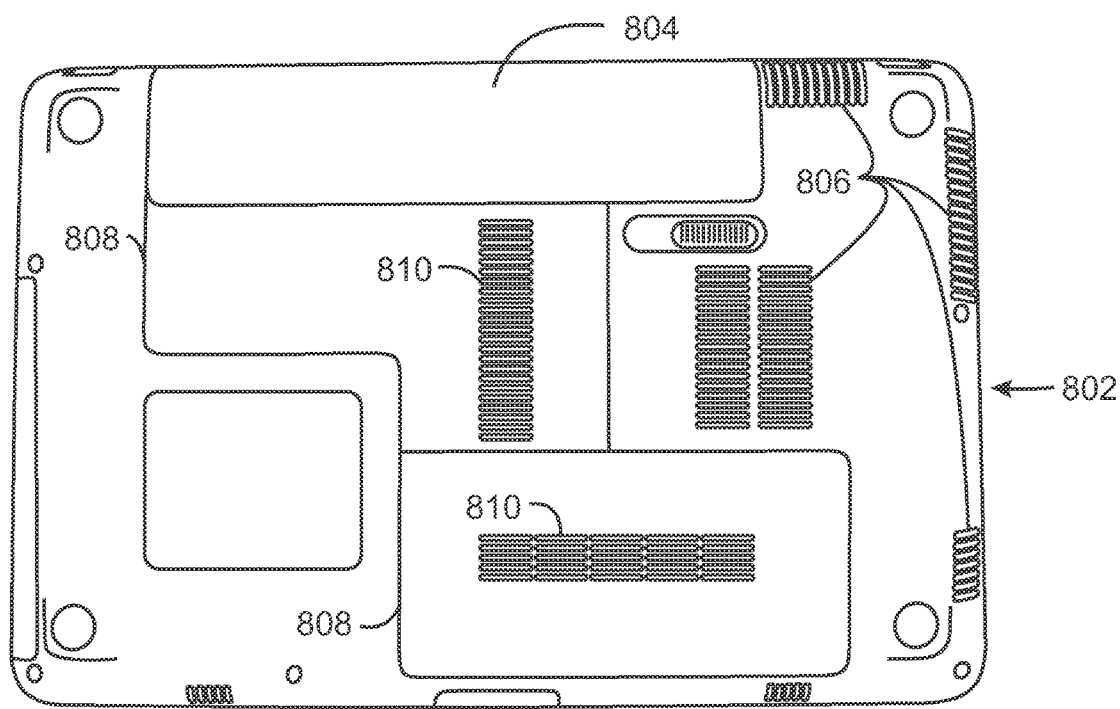
FIG. 8A is a bottom view of a current laptop housing.

FIG. 8A is a bottom view of a current laptop housing 802. The laptop housing 802 has a battery cover 804 and a number of vents 806 configured to allow air flow to cool heat generating parts. As for the AIO computer housing discussed with respect to FIG. 6A, the laptop housing 802 can have a number of removable sub-panels 808 to allow access to other components, such as drives, memory, processors, and the like. Each of the sub-panels 808 can also have vents 810 to provide cooling to these components.

Figure 8B:
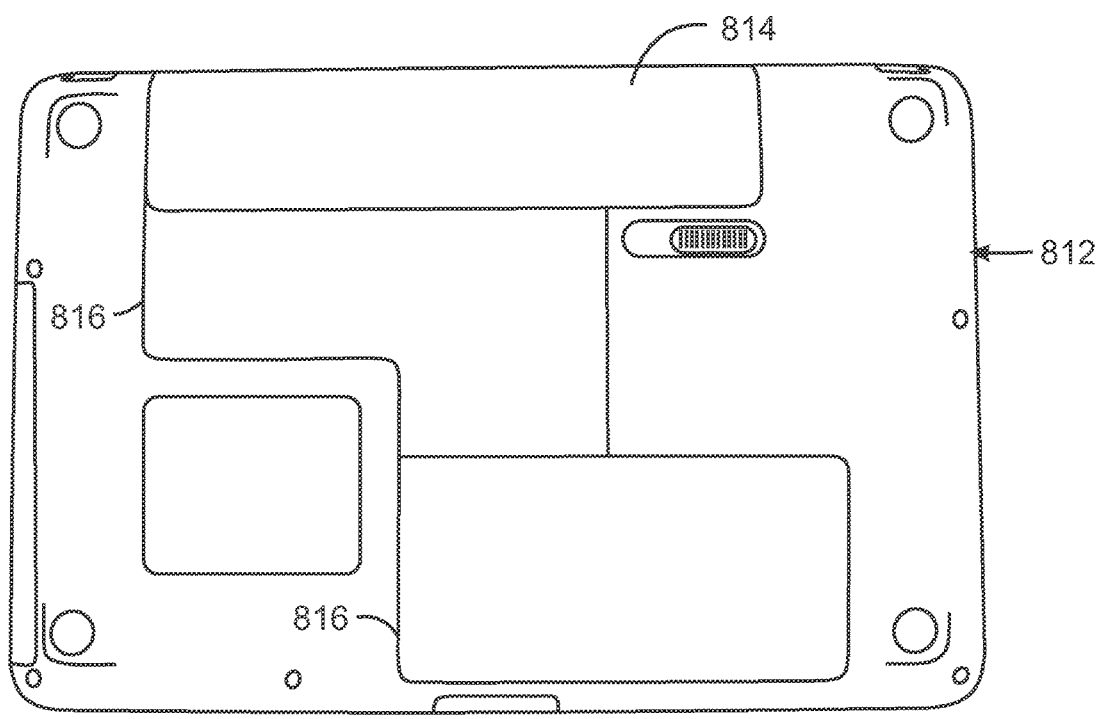
FIG. 8B is a bottom view of a laptop housing 812 formed from a porous material.

FIG. 8B is a bottom view of a laptop housing 812 formed from a porous material. As the porous material allows air to flow into the entire case, the vents may be eliminated. The sub-panels 816 may also be formed from the porous material, allowing the elimination of those vents, as well. The elimination of the vents not only provides a smoother profile, but also increases the resistance of the laptop to harsh environments. Further, the battery panel 814 can be formed from the porous material, providing additional cooling for the electronics and for the battery.

Figure 9:
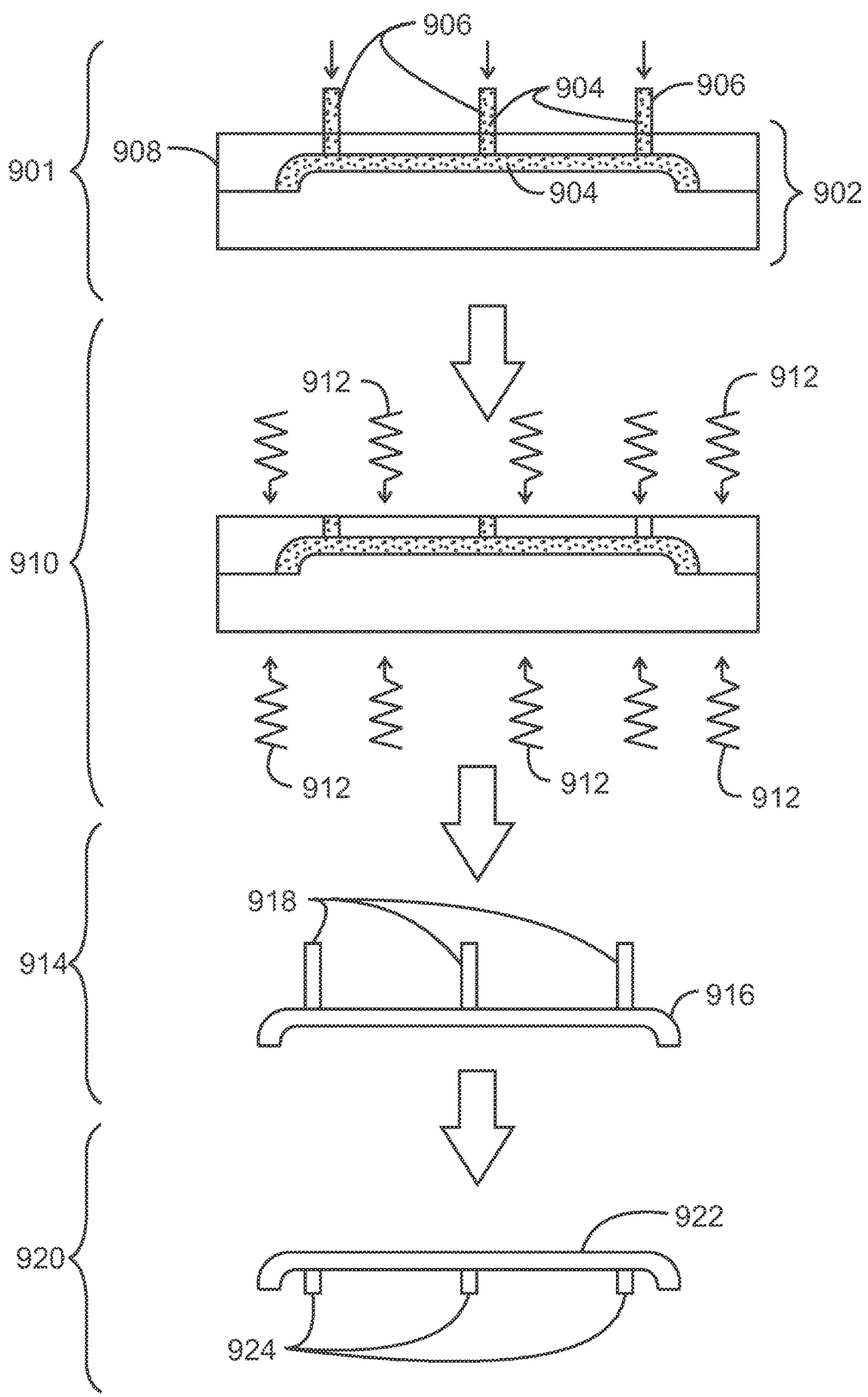
FIG. 9 is a schematic illustrating the formation of a porous housing panel for an electronic device.

FIG. 9 is a schematic illustrating the formation 900 of a porous housing panel for an electronic device. The formation 900 of the panel can be thought of in four stages. In a mold filling stage 901, a mold 902 of the panel is closed, and particles 904 are introduced into the mold 902, for example, through ports 906 that are formed in the upper section 908 of the mold. The particles 904 can include small plastic spheres that are poured into the mold 902. However, the placement of the particles 904 is not limited to this technique. For example, the mold 902 may be submerged in a bin of plastic spheres and closed to form the porous panel. Further, while plastic spheres may provide a more uniform packing of the mole, giving a narrower pore size distribution, plastic pellets may also be used.

Another technique that may be used to place particles 904 in the mold is metal injection molding (MIM). In this technique, a binder is compounded with fine metal particles to form a master batch. The metal particles may include aluminum, titanium, or any number of other metals or alloys. The binder can include high impact polystyrene (HIPS), polystyrene (PS), polyacrylate, polyethylene, polypropylene, or any number of other materials. The master batch is melted in an injection molding machine and injected into the mold 902.

Any number of plastics may be used to form the plastic spheres or pellets used to fill the mold. However, the porous panels must meet certain fire resistance standards, e.g., UL94, for use in consumer electronics. This can be a challenge for many plastics, but may be more problematic for the porous panels, as the increased surface area from the pores can make the panels more susceptible to ignition and burning. Various techniques can be used to make the panels less flammable. For example, the plastic spheres or pellets can be formed from a fire resistant polymer, such as a polyphenylene sulfide or a polyetherimide, among others. The plastics can also be compounded with fire retardant additives to meet the standard. Such additives can include silicon compounds, nitrogen compounds, phosphorous compounds, and halogens, and are widely available. For example, siloxane fire retardant additives are available from Dow Corning® under the name "Si Powder Resin Modifiers." Other materials include the Firemaster® brominated fire retardants available from Great Lakes Solutions, a Chemtura Company.

After the mold is filled, the molding stage 910 can be completed. For parts formed using MIM, this stage involves cooling the plastic part to form a green part. If plastic spheres are used as the particles 904, the mold 902 is heated to partially sinter the particles 904 to form the porous part, as indicated by the arrows 912. The size of the pores and the total porosity is determined by the size and shape of the pellets, and the temperature, time for the sintering, and the pressure applied to the mold during the sintering process. The conditions for the sintering process may be qualitatively determined. For example, the temperature control may involve bringing the bulk temperature of the polymer particles to within a few degrees of the Tg temperature and then flash heating the outer shell of the spheres to Tg, allowing the particles to fuse together while the inner volume of the particles stay under the Tg to maintain the composure of shape. Pressure may be applied to slightly compact the particles and increase particle to particle surface contact (fused surface). The mold temperature may be for a partial duration of the sintering slightly above the Tg to allow deformation of the outer particles resulting in a flat side to the particle to create the illusion of a solid surface. The final pore volume for the porous panel may be between about 25% and about 60%. Lower volumes may not allow sufficient air flow through the porous panel, while high volumes may be too fragile to be practical. In some embodiments, the pore volume may be between about 30% and about 40%.

Once the molding stage 910 is completed, a finishing stage 914 can be performed. In the finishing stage, the part 916 is cooled and ejected from the mold 902. For the plastic part, the removal of the injection port shapes 918 from the panel provides the porous panel.

For the MIM process, the part 916 is a green part needing further processing. Once the injection port shapes 918 are removed, the part can be treated to remove a portion of the binder. This can be done by a heating process that burns off a portion of the binder. In another technique, the part is treated with solvent to partially dissolve the binder. The removal of the binder forms a fragile part terms a brown part. The brown part can be sintered at high temperatures to remove the remaining binder and partially fuse the metals particles. The sintering is performed at temperatures that approach the melting point of the metal, for example, being between about 50° C. and about 5° C. below the melting point of the metal. The porosity is controlled by the sintering time, where shorter times will form a more porous panel and longer times will form a less porous panel. A similar qualitative process to that used for the plastic particles may be used to determine the sintering conditions for the metal particles.

Once the finishing stage 914 is completed, an assembly stage 920 can be performed. In the assembly stage 920, the porous panel 922 can have hardware 924, such as mounting brackets, posts, and the like, attached to prepare the porous panel 922 for use in the housing.

It is to be understood that the forming procedures are not limited to the stages or actions shown in FIG. 9. Other procedures may be used in addition to, or instead of, the stages shown. For example, similar steps may be used to form a composite porous panel, composed of an inner porous sheet and an outer porous sheet, and a fiber mesh in between the inner and outer sheet. The inner porous sheet and the outer porous sheet may be individually formed using the stages discussed above. The inner porous sheet may be optimized for low impedance to air flow, e.g., having more porosity or larger pore sizes to increase the pore volume. The outer porous sheet may be optimized for a finer texture, for example, using smaller plastic particles to produce a more appealing surface texture and look. In some examples, the outer sheet can be very thin in comparison to the inner sheet, and, thus, minimize impedance to air flow while maintaining a desirable cosmetic look. Further, this arrangement can be used to provide enhanced water resistance, since the outermost layers provide most of the protection from fluid ingress.

Figure 10:
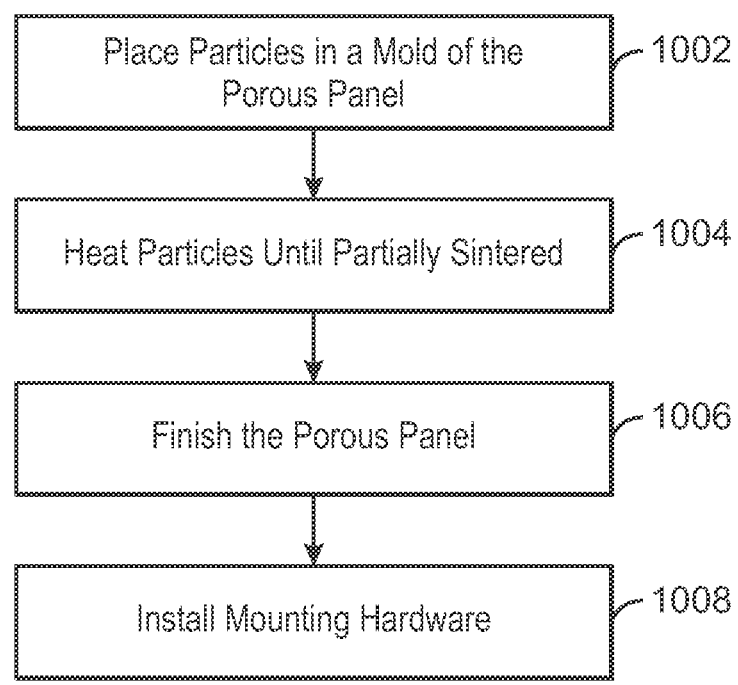
FIG. 10 is a block diagram of a method 1000 for forming a housing for an electronic device.

The fiber mesh may be made out of carbon fiber, glass fiber, metal fiber, or polymer fibers. In the case of polymer fibers, the glass transition temperature, $T_g$, can be selected to be compatible with the inner porous sheet and the outer porous sheet such that bonding occurs between the inner sheet, fiber mesh, and outer sheet, while the fiber mesh retains its structural properties as a tensile reinforcement. This provides a strength increase in bending and tensile strain conditions to compensate for the inherent reduction in mechanical properties due the porosity of the media FIG. 10 is a block diagram of a method 1000 for forming a housing for an electronic device. The method 1000 begins at block 1002 with particles placed in a mold of the porous panel. This may be done by the methods described with respect to FIG. 9. At block 1004, the particles are heated until they are partially sintered together forming the porous panel. For panels made by MIM, this may be done after the green part is injected from the mold, and the binder is partially removed. At block 1 006, the porous panel is finished, for example, using the methods described with respect to FIG. 9. At block 1008, mounting hardware is attached to the porous panel to allow the porous panel to be assembled with a display and a circuit board to form the electronic device.

Example 1

An example of an electronic device is described herein. The electronic device includes an integrated display and a circuit board comprising a processor, a memory, and a driver circuit coupled to the integrated display. A housing encloses the integrated display and the circuit board, wherein the housing is comprised of at least two panels wherein at least one of the panels is formed from a porous material configured to allow air flow through the panel.

Example 2

An example of a housing for an electronic device is described herein. The housing for an electronic device includes at least two panels wherein at least one of the panels is a porous plastic panel, configured to allow air flow through the porous plastic panel, wherein the porous plastic panel is configured to decrease flammability Example 3

An example of a method of making a porous panel for a housing of an electronic device is described herein. The method includes placing particles in a mold of the porous panel. The particles are heated until they are partially sintered together, forming the porous panel. The porous panel is finished and mounting hardware is attached to the porous panel to allow the porous panel to be assembled with a display and a circuit board to form the electronic device An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which one is called a second element is arbitrary.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. An electronic device, comprising:
   an integrated display;
   a circuit board of heat generating parts comprising a processor, a memory, and a driver circuit coupled to the integrated display; and
   a housing enclosing the integrated display and the circuit board, wherein the housing comprises a first layer of porous material, a fiber mesh, and a second layer of porous material, where the first layer of porous material comprises larger pores relative to the pores of the material of the second layer of porous material, and where the fiber mesh separates the first layer of porous material from the second layer of porous material.

2. The electronic device of claim 1, comprising a rear housing panel formed from the first layer of porous material, the fiber mesh, and the second layer of porous material.

3. The electronic device of claim 1, comprising a front housing panel formed from the first layer of porous material, the fiber mesh, and the second layer of porous material.

4. The electronic device of claim 1, comprising a sub-panel formed from the first layer of porous material, the fiber mesh, and the second layer of porous material and configured to engage fasteners to hold the sub-panel to a front housing panel or a rear housing panel.

5. The electronic device of claim 1, comprising an all-in-one (AIO) computer system.

6. The electronic device of claim 1, comprising a laptop computer, a tablet, or a mobile phone.

7. The electronic device of claim 1, wherein the first layer of porous material and the second layer of porous material comprise partially sintered metal particles.

8. The electronic device of claim 1, wherein the first layer of porous material and the second layer of porous material comprises partially sintered plastic pellets.

9. The electronic device of claim 8, wherein the plastic pellets comprise a fire resistant material.

10. The electronic device of claim 8, wherein the plastic pellets comprise a poly(phenylenesulfide), a polyimide, a polyetherether ketone, or any combinations thereof.

11. The electronic device of claim 1, comprising at least one panel formed from the first layer of porous material, the fiber mesh, and the second layer of porous material, the at least one panel is made by: injecting a binder comprising metal particles into a mold to form a green panel; heating the green panel to burn off at least a portion of the binder, forming a brown panel; and heating the brown panel to sinter the metal particles, forming a porous panel first layer of porous material, the fiber mesh, and the second layer of porous material.

12. The electronic device of claim 1, wherein the the first layer of porous material has a low impedance to air flow relative to the second layer of porous material, and wherein the first layer of porous material is located on an interior of the housing and the second layer of porous material comprises pores less than 250 micrometers in size.

13. A housing for a target electronic device, comprising a first layer of omni-directional porous material, a fiber mesh, and a second layer of omni-directional porous material, where the first layer of omni-directional porous material comprises larger omni-directional pores relative to the omni-directional pores of the omni-directional porous material of the second layer of omni-directional porous material, and where the fiber mesh separates the first layer of omni-directional porous material from the second layer of omni-directional porous material,
   wherein the second layer of the omni-directional porous material is externally facing and the first layer of the omni-directional porous material is internally facing relative to components of the target electronic device.

14. The housing of claim 13, wherein the first layer of omni-directional porous material and the second layer of omni-directional porous material are configured to be substantially self-extinguishing when set on fire.

15. The housing of claim 13, wherein the first layer of omni-directional porous material and the second layer of omni-directional porous material comprise a polymer and a fire inhibitor.

16. The housing of claim 13, wherein the first layer of omni-directional porous material and the second layer of omni-directional porous material comprise a poly(phenylenesulfide), a polyimide, a polyetherimide, a polyetherether ketone, or any combinations thereof.

17. The housing of claim 13, wherein the first layer of omni-directional porous material and the second layer of omni-directional porous material are formed by: placing particles in a mold of the first layer of omni-directional porous material and the second layer of omni-directional porous material; heating the particles until they are partially sintered together forming the first layer of omni-directional porous material and the second layer of omni-directional porous material, wherein a pore size of the first layer of omni-directional porous material and the second layer of omni-directional porous material is determined, at least in part, by lowering airflow impedance of a first layer of omni-directional porous material relative to the second layer of the omni-direction porous material; finishing the first layer of omni-directional porous material and the second layer of omni-directional porous material; and attaching mounting hardware to the first layer of omni-directional porous material to allow the first layer of omni-directional porous material and the second layer of omni-directional porous material to be assembled with a display and a circuit board to form the heat generating electronic device.

18. The housing of claim 17, wherein finishing the first layer of omni-directional porous material and the second layer of omni-directional porous material comprises:
    cooling the first layer of omni-directional porous material and the second layer of omni-directional porous material; and
    polishing the first layer of omni-directional porous material and the second layer of omni-directional porous material.

19. The housing of claim 17, wherein placing particles in the mold comprises flowing plastic pellets into the mold.

20. The housing of claim 19, comprising forming the plastic pellets by blending a flame retardant material with a plastic.

* * * * *